United States Patent [19]

Ephrath et al.

[11] Patent Number: 4,473,598
[45] Date of Patent: Sep. 25, 1984

[54] METHOD OF FILLING TRENCHES WITH SILICON AND STRUCTURES

[75] Inventors: Linda M. Ephrath, Danbury, Conn.; Victor J. Silvestri, Hopewell Junction; Denny D. Tang, Pleasantville, both of N.Y.

[73] Assignee: International Business Machines Corporation, Armonk, N.Y.

[21] Appl. No.: 393,997

[22] Filed: Jun. 30, 1982

[51] Int. Cl.$^3$ .................................................. H01L 21/76
[52] U.S. Cl. ................................ 427/86; 29/576 W; 156/612; 156/643; 427/93; 427/94; 427/95; 427/126.4
[58] Field of Search .................. 427/86, 93–95, 427/126.4; 156/643, 612–614; 29/576 W

[56] References Cited

U.S. PATENT DOCUMENTS

| | | | |
|---|---|---|---|
| 3,425,879 | 2/1969 | Shaw et al. | 148/175 |
| 3,969,168 | 7/1976 | Kuhn | 156/17 |
| 3,979,237 | 9/1976 | Morcom et al. | 156/3 |
| 3,998,673 | 12/1976 | Chow | 148/175 |
| 4,191,788 | 3/1980 | Harington | 427/86 |
| 4,255,207 | 3/1981 | Nicolay | 427/86 |
| 4,256,514 | 3/1981 | Pogge | 156/643 |

OTHER PUBLICATIONS

IBM Technical Disclosure Bulletin, vol. 23, No. 2, Jul. 1980, "Reproducible Technique for Simultaneous Deposition of Poly-Epi on Oxide-Silicon", V. J. Silverstri and D. D. Tang; pp. 819–820.

J. Electrochem. Soc.: Solid State Science, vol. 114, No. 11, Nov. 1967, "Behavior of Large-Scale Surface Perturbations during Silicon Epitaxial Growth", W. R. Runyan, Earl G. Alexander, and S. E. Craig, Jr.; pp. 1154–1158.

J. Electrochem. Soc.: Reviews and News, vol. 127, No. 3, Mar. 1980, "Microlithography-Key to Solid-State Device Fabrication", C. A. Deckert and D. L. Ross; pp. 45C–46C.

IEEE Transactions on Electron Devices, vol. ED-28, No. 11, Nov. 1981, "Reactive Ion Etching for VLSI", Linda M. Ephrath; pp. 1315–1319.

Reprinted from "Semiconductor Silicon 1981", Copyright 1981 by The Electrochemical Society, Inc., Dry Etching for VLSI-A Review, L. M. Ephrath; pp. 627–637.

Primary Examiner—John D. Smith
Attorney, Agent, or Firm—Pollock, Vande Sande & Priddy

[57] ABSTRACT

Isolation regions in a semiconductor substrate are formed by covering at least one of the surfaces within a trench within the substrate with non-nucleating material, providing a layer of nucleating material on at least one surface of the non-nucleating material and then filling the trench with polycrystalline silicon or epitaxial silicon or both.

26 Claims, 13 Drawing Figures

METHOD OF FILLING TRENCHES WITH SILICON AND STRUCTURES

TECHNICAL FIELD

The present invention is concerned with a method for filling trenches in semiconductor substrates with polycrystalline silicon or epitaxial silicon or both. In particular, the process of the present invention is concerned with the filling of trenches in the semiconductor substrate wherein the trenches are employed for device isolation purposes.

BACKGROUND ART

It has been suggested to form deep trenches in semiconductor substrates and then to refill the trenches in order to provide isolation between active regions or devices in the substrate. For instance, deep trenches can be formed according to the procedures disclosed in U.S. Pat. No. 4,256,514 to Pogge. The refill techniques employed in deep trench formations have been chemical vapor deposition (i.e. CVD) systems. Such systems involve a homogeneous gas phase reaction; whereby the silicon dioxide or polycrystalline silicon formed in the gas from the reactive gas species present, essentially "drop" onto surfaces and into the trench structures. However, such process suffers from a serious reliability problem in that there is a tendency to form large voids within the trench. In fact, frequently voids are formed at the bottom of the trenches and/or large continuous openings are formed extending to the final surface after subsequent planarization. Moreover, the refill deposited by such procedure can be structurally deficient (e.g., loosely packed) which can lead to problems in future processing. The presence of voids has a tendency to magnify the formation of defects in silicon areas later to serve as active or device regions. This is particularly so if the formation continues up to the surface followed by subsequent oxidation or isolation. Moreover, substrate surfaces which are relatively densely populated with trenches in some areas and less densely populated in others have been found to display local deposition thickness variations. This is due to depletion effects arising from the presence of increased area. These overall surface variations can cause problems in later planarization steps.

DISCLOSURE OF INVENTION

The present invention makes it possible to significantly reduce, if not entirely eliminate, the problem of void formation in isolation trenches experienced by prior techniques. In addition, certain preferred aspects of the present invention provide for relatively fast filling of the trenches at moderate temperatures (e.g.— about 1000° C.).

The present invention is concerned with a method for forming isolation regions in a semiconductor substrate, which substrate has at least one trench therein. The method of the present invention includes covering at least one of the surfaces within the formed trench or trenches with non-nucleating material; providing a layer of nucleating material on at least one surface of the non-nucleating material; and then filling the trench with polycrystalline silicon or epitaxial silicon or both by growing the silicon perpendicular from the surface(s) containing the nucleating material.

In addition, the present invention is concerned with composites obtained by the above process wherein the trench is filled with void-free polycrystalline silicon or epitaxial silicon or both.

BEST AND VARIOUS MODES FOR CARRYING OUT INVENTION

For convenience, the discussion of the fabrication steps is directed to employing a P-type silicon substrate as the semiconductor substrate and N-type impurities as the dopant impurities. Of course, it is understood that the N-type substrate and P-type dopant impurities can be employed according to the present invention. Also, when the discussion refers to horizontal and/or vertical surfaces or walls, such refers to the direction in relationship to the major surfaces of the substrate.

It is understood that when the discussion refers to N-type impurities, the process steps are applicable to P-type impurities and vice versa. Also, the present invention is applicable to substrates other than silicon. Moreover, the terms "polysilicon" and polycrystalline silicon are used herein interchangeably as in the prior art.

Figure 1:
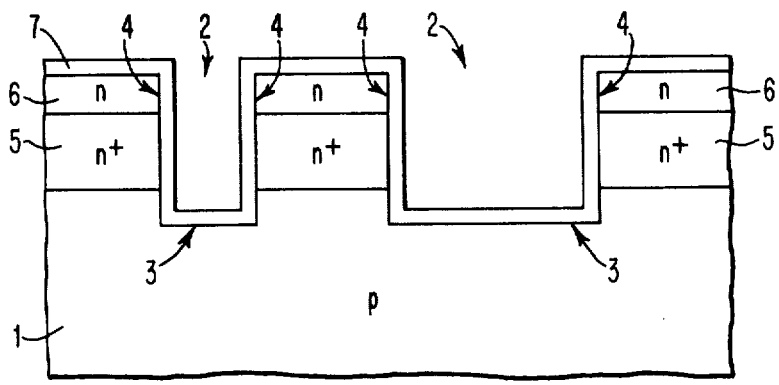
FIGS. 1–6 are cross-sectional views of a substrate in various stages of fabrication demonstrating the basic process of the present invention.

Referring to FIG. 1, there is shown a fragment of semiconductor substrate 1 having trenches 2 therein. The substrate is shown as a P-type silicon substrate which can have any desired crystal orientation (e.g. .—<100>). Such a substrate can be prepared by slicing and polishing a P-type silicon boule grown in the presence of a P-type dopant such as boron following conventional crystal growth techniques. Other P-type dopants for silicon include aluminum, gallium, and indium.

The deep trenches 2 have a substantially horizontal surface 3 and substantially vertical surfaces 4 in the silicon substrate 1. Generally, the vertical surfaces 4 are substantially vertical and equal to or less than about 5° from the vertical. The trenches can be formed by the process disclosed in U.S. Pat. No. 4,256,514 to Pogge, disclosure of which is incorporated herein by reference. Generally, the ratio of the depth of the trench to the width of the trench is at least about 3.5 to 2.5. Of course, larger ratios are contemplated such as about 4 to 1 and are within the scope of the present invention. Typically, the depth of the trench is about 3.5 to 4 microns and the width is about 1 to 2.5 microns.

Adjacent the lower portion of the trenches 2 are n+ regions 5 and adjacent the upper portion of the trenches are n regions 6. Such regions are desirably formed by ion implantation or thermal diffusion and can be carried out prior to or subsequent to the formation of trenches 2. The dopant can be carried out by well-known techniques which need not be described here in any further detail.

A non-nucleating layer 7 such as silicon dioxide, silicon nitride, aluminum oxide, or mixtures thereof, is grown on at least one of the surfaces within trench 2 such as on the vertical surfaces 4 within trench 2. For convenience, layer 7 is also grown along the horizontal surface 3 of trench 2. The non-nucleating layer is a relatively thin layer of about 0.2 nm to about 0.5 nm and typically about 0.3 nm thick. The non-nucleating layer can be provided by any well-known methods such as by thermal oxidation. In addition, the thickness of the non-nucleating layer on surface 3 need not be the same as the thickness of the non-nucleating layers on surface 4. Preferably the non-nucleating layer 7 is provided on at least one of the surfaces located along the longest axis of the trench. In the structure shown in FIG. 1, the longest axis is along the vertical walls 4 of the trench.

Figure 2:
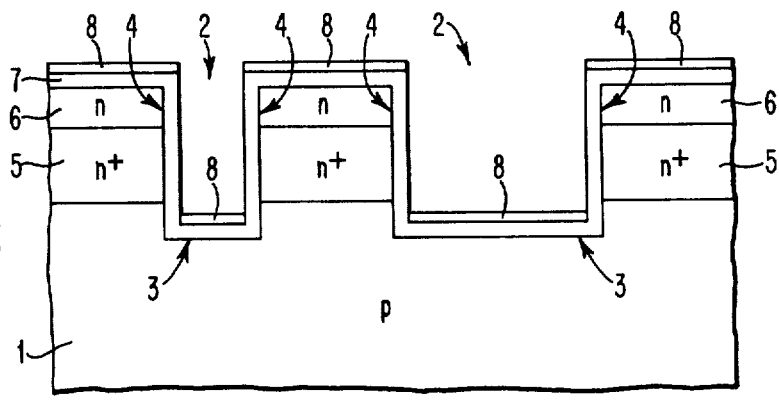
Figure 3:
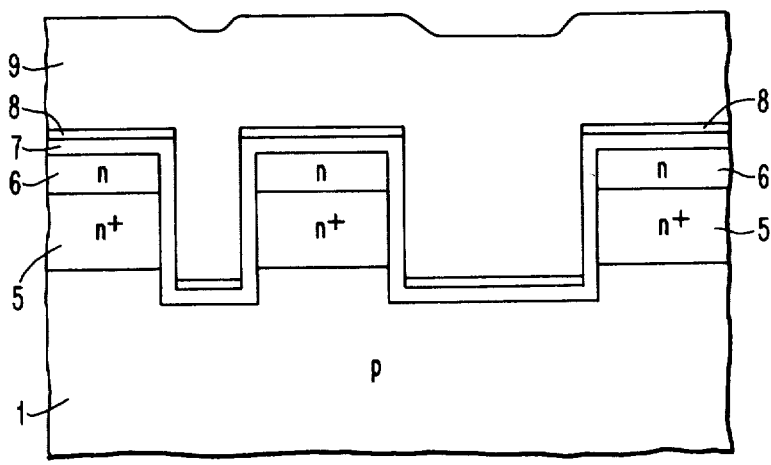

Next, a layer 8 of nucleating material is formed on at least one of the surfaces of the non-nucleating layer 7 as shown in FIG. 2. Typically, this layer is about 500 to about 3000 angstroms thick. It has been noted that if the nucleating layer is too thin, or less than about 500 angstroms, then back etching can occur during the filling technique which thereby causes void formation and decreased speed in the filling technique. Such can be deposited by either atmospheric or a low pressure CVD technique to provide polycrystalline silicon. It is preferred that the relatively thin nucleating agent be deposited by low temperature techniques such as temperatures up to about 650° C. FIG. 2 illustrates a preferred configuration of the present invention wherein the nucleating layer 8 is present only on the horizontal surface 3 of the trench and on the horizontal surfaces of the non-nucleating layer on top of the silicon substrate.

Figure 7:
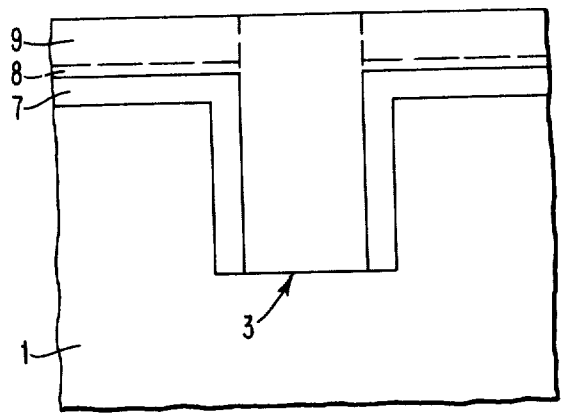
FIGS. 7–13 are cross-sectional views of representative substrates containing the nucleating layer on various alternative surfaces suitable for carrying out the present invention.
Figure 8:
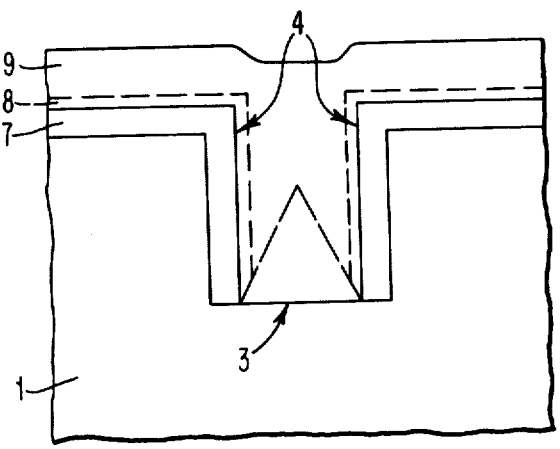
Figure 9:
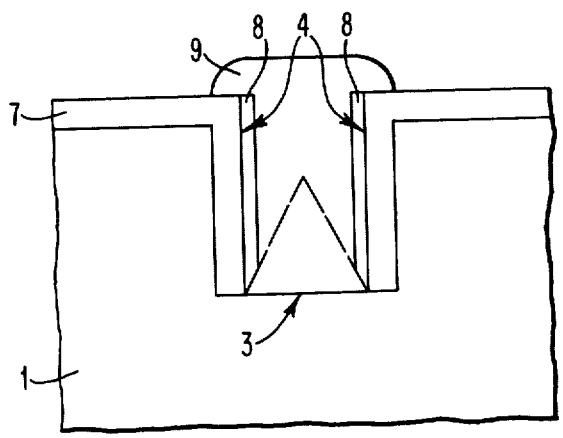
Figure 10:
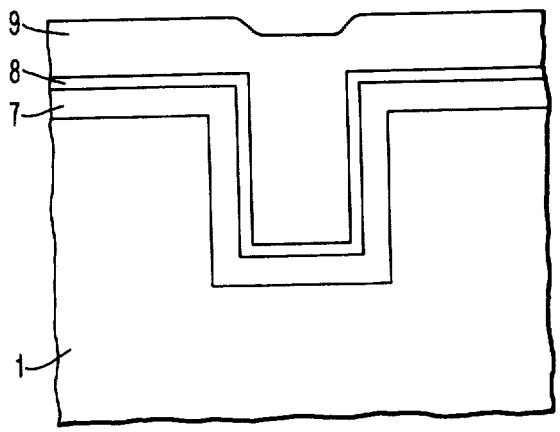
Figure 11:
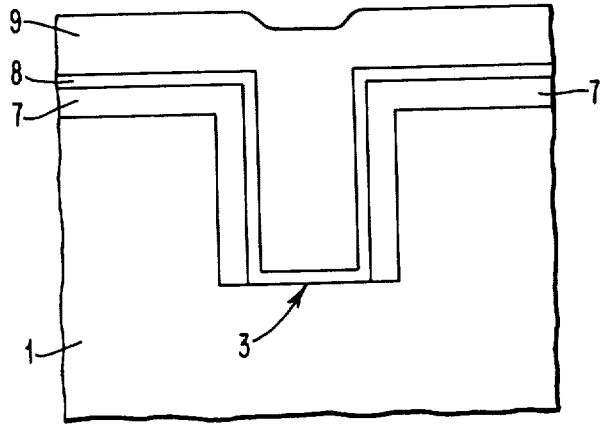

Other configurations of providing the nucleating layer within the scope of the present invention are shown in FIGS. 7 through 13. For instance, FIG. 7 shows the nucleating layer 8 on top of the non-nucleating material 7 on the horizontal surface of the substrate located out of trench 2. The bottom 3 of trench 2 is exposed silicon which also acts as a nucleating material. Non-nucleating material 7 is present on the vertical walls of the trench. FIG. 8 illustrates covering the non-nucleating material 7 on the vertical walls 4 of the trench and the horizontal layer outside of the trench with a nucleating layer. The horizontal surface 3 of trench 2 is exposed substrate 1. FIG. 9 illustrates providing nucleating material 8 on the non-nucleating material 7 on the vertical sidewalls 4 of trench 2. The horizontal bottom portion 3 of trench 2 is exposed silicon. FIG. 10 illustrates providing a nucleating layer 8 on all surfaces above non-nucleating material 7. FIG. 11 illustrates providing a nucleating layer 8 over all of the surfaces of trench 2 wherein the horizontal surface 3 of trench 2 is exposed silicon substrate and the vertical surfaces 4 of trench 2 are non-nucleating material 7. The techniques illustrated in FIGS. 8-11 are not particularly preferred since small amounts of voids have been noted in their formation.

Accordingly, it is preferred that the nucleation within the trench be present on the surface or surfaces in only one direction. In other words, it is preferred that the nucleation within the trench be present on only either the vertical surfaces 4 or on the horizontal surface 3 of the trench.

Figure 12:
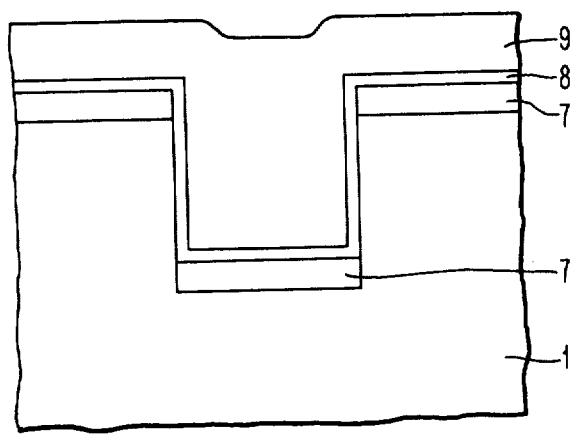

FIG. 12 illustrates providing a non-nucleating material layer 7 on the horizontal surface of trench 2 and on the horizontal surfaces located outside of trench 2. The nucleating layer 8 is provided over all surfaces of the trench (i.e.—vertical walls 4, horizontal surface 3) and on the horizontal surface above the non-nucleating layer 7 on the substrate located out of trench 2.

Figure 13:
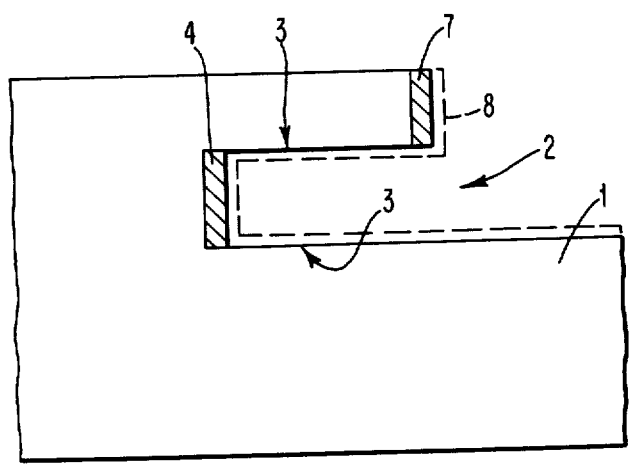

It is also understood that the present invention is applicable to filling trenches which are located substantially parallel to or at any angle to the top surface of the substrate in addition to the trenches shown which are substantially perpendicular to the top surface of the substrate. For example, see Example 13 for one illustration of a structure wherein the trench is rotated about 90° from that shown in FIG. 12. In particular, FIG. 13 illustrates providing a non-nucleating material layer 7 on the vertical surface of the trench 2. The nucleating layer 8 is provided over all surfaces of the trench and on the vertical surfaces outside of the trench. The preferred nucleating layer is polycrystalline silicon.

Next, silicon 9 is grown in trench 2 and on all surfaces containing the nucleating material. The preferred method of growing the silicon according to the present invention is by a gas-solid or heterogeneous reaction system. In particular, the growth occurs perpendicular from the nucleated surfaces. The heterogeneous reaction system desirably includes hydrogen, silicon, and chlorine. A particularly preferred system is a combination of $SiCl_4$—$H_2$ as discussed by Silvesteri and Tang—Reproducible Technique for Simulaneous Deposition of Poly-Epi on Oxide-Silicon, IBM Technical Disclosure Bulletin, Volume 23, No. 2, July 1980, pages 810 and 820, disclosure of which is incorporated herein by reference.

The problem addressed by the present invention of void formation in deep trenches was not encountered in the process discussed by Silvestri and Tang in said publication since such is not concerned with deep trench filling.

The filling process is generally carried out at temperatures between about 900° to about 1100° C. and preferably about 1000° C. to provide a sufficiently fast filling of the trenches. It is important that the filling technique occur in about 20 minutes or less so that the dopant impurities already present in the substrate are not disturbed due to the exposure to elevated temperatures. With the typical dimensions discussed hereinabove, the fill process rate to provide a practical process is at least about 0.22 microns per minute.

In addition to the ability to achieve void-free fill, the technique employed also improves the planarity of the surfaces as discussed in said IBM Technical Disclosure Bulletin.

The type of silicon fill that will be present within the trenches will depend upon the type of nucleating surface present. For instance, polycrystalline nucleating surfaces will result in the formation of polycrystalline silicon. On the other hand, silicon nucleating surfaces, such as shown in FIGS. 7, 8, and 9 will result in epitaxial silicon growth. Accordingly, as illustrated in FIGS. 7, 8, and 9 there will be a combination of polycrystalline silicon and epitaxial silicon.

It has been noted that the silicon in the above types of systems grow faster within holes than on adjacent flat surfaces on single crystal surfaces. Along these lines, see Runyan et al, Journal Electro-Chemical Society, Behavior of Large-Scale Surface Perturbations During Silicon Epitaxial Growth, November 1967, pages 1154–1157. This phenomenon may be due to the existence of higher temperatures at the bottom of the hole and the lack of carrier gas flow in the holes. In addition, in view of the fact that the growth in the trench is faster than on the adjacent flat surfaces, the surface topology is improved.

Figure 4:
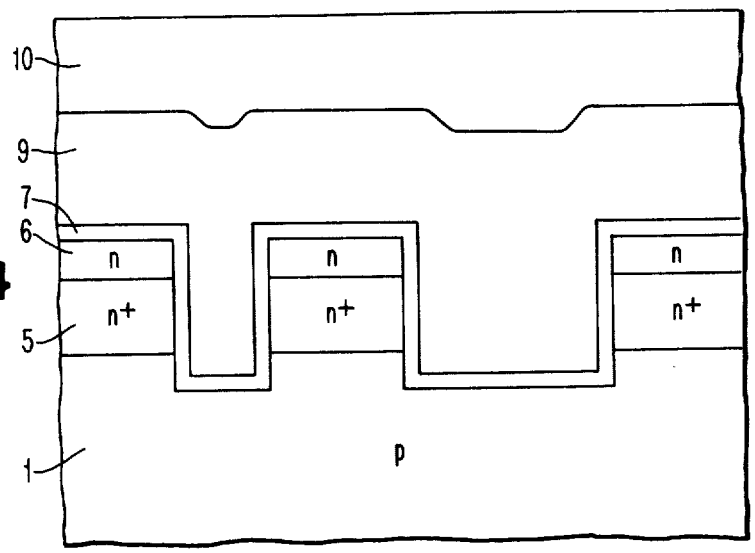

Next, the silicon layer 9 is planarized such as following a planarization technique along the lines discussed in U.S. Pat. No. 4,256,514 to Pogge employing either Cl/argon or $CBrF_3$. However, the preferred technique employed according to the present invention comprises providing a relatively thick layer of resist material 10 over the grown silicon surfaces as illustrated in FIG. 4. The photoresist material can be applied by well-known techniques such as spinning on or by spraying. The photoresist material tends to flow and provide substantially level surface as demonstrated in FIG. 4. The particular photoresist material employed for this purpose of the present invention is not critical and any type, negative or positive, of photoresist material can be employed. This is possible since the subsequent steps, as will be discussed hereinbelow, are not dependent upon the chemical identity of the photoresist material. Examples of suitable photoresist materials include compositions based on phenolformaldehyde novalak polymers. A particular example of such is Shipley 1350 which is an m-cresol formaldehyde novalak polymer composition. Such is a positive resist composition and includes therein a diazoketone, such as 2-diazo-1-naphthol-5-sulphonic acid ester. The composition usually contains about 15% by weight of the diazoketone compound. In addition, in other systems, the diazoketone is attached directly to the polymer molecules. A discussion of photoresist materials can be found, for instance, in Journal of the Electrochemical Society, Vol. 125, No. 3, March 1980—Deckert et al, "Micro-lithography—Key to Solid-State Fabrication", pp. 45C to 56C, disclosure of which is incorporated herein by reference. The photoresist is generally applied in a thickness of about 2 nm.

Next, the structure is subjected to reactive ion etching. The apparatus disclosed in Ephrath, IEEE Transactions on Electron Devices, Reactive Ion Etching for VLSI, Vol ED-28, No. 11, November 1981, pp. 1315 to 1319 and Ephrath, Semiconductor Silicon 1981, The Electrochemical Society, Dry Etching for VLSI-A Review pp. 627 to 637, disclosures of which are incorporated herein by reference, can be employed for this purpose.

The reactive ion etching procedure employs conditions such that polycrystalline silicon and/or epitaxial silicon etches at the same rate as the photoresist material and at a rate substantially higher than silicon dioxide. The relative amount of the reactive gases, in particular $CF_4$ and $O_2$, the pressure and the rf power to the two electrodes are adjusted such that the epitaxial silicon is about 1. A particularly preferred system contains about 20% by volume of $O_2$ at a pressure of about 100 millitorr. The rf power density to the substrate electrode is 0.27 W/cm$^2$ and the rf power density to the substrate electrode is 0.1 W/cm$^2$. The flow rate of the etching gas is about 40 SCCM and the temperature of the wafer is between 60° and 100° C. Under these conditions, the etch rate of silicon and photoresist is about 60 nm/min and the etch rate of $SiO_2$ is 7.0 nm/min. Thus, etching stops at the oxide surface 7.

Figure 5:
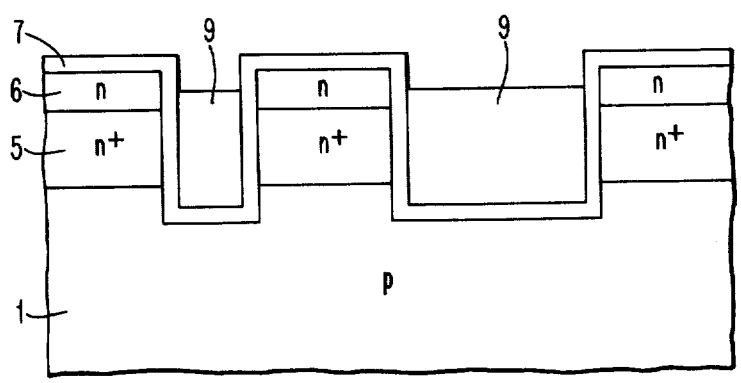
Figure 6:
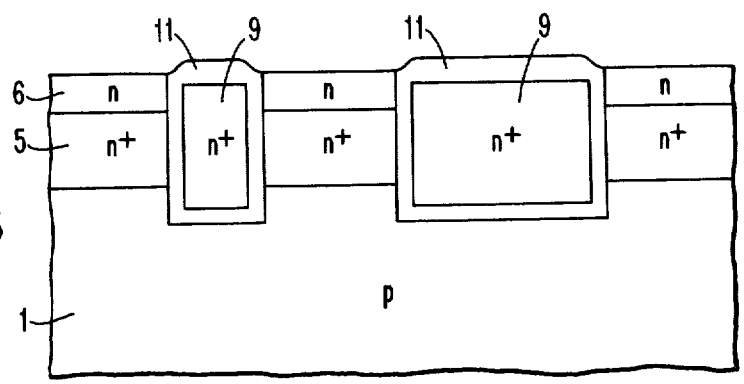

If desired, as illustrated in FIG. 5, the silicon is etched a small distance inside the trench 2, such as about 200 nm.

Next, the particular devices can be fabricated on and in the substrate. For instance, as an example, the surfaces of the remaining polycrystalline silicon 9 in the trench can be doped to provide an n+ region such as being doped with $POCl_3$. If desired, the polycrystalline silicon can now be oxidized to provide isolation regions 11 on top of the n+ regions. It is noted that the polycrystalline silicon, since it is heavily doped, is oxidized about 4 times as fast as oxidation growth on the epitaxial silicon at a temperature of about 800° C. Accordingly, subsequent to the oxide remaining on the polycrystalline silicon, but exposing the epitaxial silicon region.

Having thus described our invention, what we claim as new, and desire to secure by Letters Patent is:

1. A method for forming isolation regions in a semiconductor substrate having a trench therein wherein said trench has at least one surface in the horizontal direction and at least one surface in the vertical direction with respect to the top surface of said substrate which comprises:
   covering at least one of the surfaces within said trench with non-nucleating material;
   providing a layer of nucleating material on at least one surface of said non-nucleating material and wherein nucleating material located in said trench is present on surface or surfaces in only either the horizontal direction or in the vertical direction with respect to the top surface of said substrate; and then filling said trench with polycrystalline silicon or epitaxial silicon or both by growing the silicon in a perpendicular direction out from at least one surface containing said nucleating material.

2. The method of claim 1 wherein said semiconductor substrate is a silicon substrate.

3. The method of claim 1 wherein the vertical surfaces of said at least one trench are equal to or less than 5° from the vertical.

4. The method of claim 1 wherein the ratio of the depth of the trench to the width of the trench is at least about 3.5 to 2.

5. The method of claim 1 wherein the depth of the at least one trench is about 3.5 to about 4 microns and the width is about 1 to about 2 microns.

6. The method of claim 1 wherein said non-nucleating layer is selected from the group of silicon dioxide, silicon nitride, or aluminum oxide.

7. The method of claim 6 wherein said non-nucleating layer is silicon dioxide.

8. The method of claim 1 or 7 wherein the non-nucleating layer is about 0.2 to about 0.5 nm thick.

9. The method of claim 1 or 7 wherein said non-nucleating layer is about 0.5 nm thick.

10. The method of claim 1, 6, or 7 wherein said non-nucleating layer is provided on all of the exposed surfaces of the substrate.

11. The method of claim 1 wherein said layer of nucleating material is about 300 to about 2500 angstroms thick.

12. The method of claim 1 wherein said layer of nucleating material is polycrystalline silicon.

13. The method of claim 1 wherein the layer of nucleating material is present only on the horizontal surface of the at least one trench and on the horizontal surfaces of the non-nucleating layer on top of the silicon substrate.

14. The method of claim 1 wherein the layer of nucleating material is present on top of non-nucleating material on the horizontal surface of the substrate located outside of the trench and the bottom of the trench is exposed silicon.

15. The method of claim 1 wherein said layer of nucleating agent is above all of the surfaces on non-nucleating material.

16. The method of claim 1 wherein the filling occurs by employing a gas-solid heterogeneous reaction system.

17. The method of claim 16 wherein said heterogeneous reaction system includes hydrogen, silicon, and chlorine.

18. The method of claim 16 wherein said reaction system is a combination of $SiCl_4$—$H_2$.

19. The method of claim 17 wherein the filling process is carried out at a temperature between about 900° to about 1100° C.

20. The method of claim 19 wherein the filling is carried out in about 20 minutes or less.

21. The method of claim 1 which additionally includes planarizing the polycrystalline silicon or epitaxial silicon or both.

22. The method of claim 21 wherein the planarizing is carried out by reactive ion etching.

23. The method of claim 22 wherein the planarizing is carried out employing a gaseous mixture of $O_2$ and $CF_4$.

24. The method of claim 23 wherein said gas contains about 20% $O_2$ and the pressure is about 100 millitorr.

25. The method of claim 1 wherein at least one of the surfaces along the longest axis of said trench is covered with non-nucleating material.

26. The method of claim 1 wherein at least the vertical surfaces of said trench are covered with non-nucleating material.

* * * * *